United States Patent
Wang et al.

(10) Patent No.: US 9,812,426 B1
(45) Date of Patent: Nov. 7, 2017

(54) INTEGRATED FAN-OUT PACKAGE, SEMICONDUCTOR DEVICE, AND METHOD OF FABRICATING THE SAME

(71) Applicant: Taiwan Semiconductor Manufacturing Co., Ltd., Hsinchu (TW)

(72) Inventors: Chin-Te Wang, Taipei (TW); Cheng-Hsien Hsieh, Kaohsiung (TW); Hsien-Wei Chen, Hsinchu (TW); Li-Han Hsu, Hsin-Chu (TW); Tzu-Shiun Sheu, Hsinchu (TW); Wei-Cheng Wu, Hsinchu (TW); Yan-Fu Lin, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/257,920

(22) Filed: Sep. 7, 2016

Related U.S. Application Data

(60) Provisional application No. 62/356,511, filed on Jun. 29, 2016.

(51) Int. Cl.
 *H01L 25/065* (2006.01)
 *H01L 23/00* (2006.01)
 *H01L 25/00* (2006.01)

(52) U.S. Cl.
 CPC .......... *H01L 25/0657* (2013.01); *H01L 24/02* (2013.01); *H01L 24/13* (2013.01); *H01L 25/50* (2013.01); *H01L 2224/0221* (2013.01); *H01L 2224/02166* (2013.01); *H01L 2224/02206* (2013.01); *H01L 2224/113* (2013.01); *H01L 2224/13018* (2013.01); *H01L 2224/13024* (2013.01); *H01L 2224/13027* (2013.01); *H01L 2225/06513* (2013.01); *H01L 2225/06524* (2013.01); *H01L 2225/06548* (2013.01); *H01L 2225/06586* (2013.01)

(58) Field of Classification Search
 CPC ... H01L 25/065; H01L 25/0657; H01L 25/50; H01L 24/02; H01L 24/13; H01L 2224/12105
 See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |

(Continued)

*Primary Examiner* — Phuc Dang
(74) *Attorney, Agent, or Firm* — JCIPRNET

(57) ABSTRACT

A semiconductor device including an integrated circuit, a protection layer, and a conductive via is provided. The integrated circuit includes at least one conductive pad. The protection layer covers the integrated circuit. The protection layer includes a contact opening, and the conductive pad is exposed by the contact opening of the protection layer. The conductive via is embedded in the contact opening of the protection layer, and the conductive via is electrically connected to the conductive pad through the contact opening. A method of fabricating the above-mentioned semiconductor device and an integrated fan-out package including the above-mentioned semiconductor device are also provided.

20 Claims, 16 Drawing Sheets

(56) References Cited

U.S. PATENT DOCUMENTS

| | | |
|---|---|---|
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2010/0007017 A1* | 1/2010 | Wei .................. H01L 23/145 257/737 |
| 2011/0283034 A1* | 11/2011 | Kang .................. H01L 24/11 710/305 |
| 2011/0291288 A1 | 12/2011 | Wu et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0264684 A1 | 10/2013 | Yu et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0187710 A1* | 7/2015 | Scanlan .............. H01L 24/02 257/777 |
| 2016/0118355 A1* | 4/2016 | Lin .................. H01L 23/3192 257/773 |
| 2017/0005054 A1* | 1/2017 | Chiu .................. H01L 24/14 |

\* cited by examiner

INTEGRATED FAN-OUT PACKAGE, SEMICONDUCTOR DEVICE, AND METHOD OF FABRICATING THE SAME

CROSS-REFERENCE TO RELATED APPLICATION

This application claims the priority benefit of U.S. provisional application Ser. No. 62/356,511, filed on Jun. 29, 2016. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. How to ensure the reliability of the integrated fan-out packages is an important issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
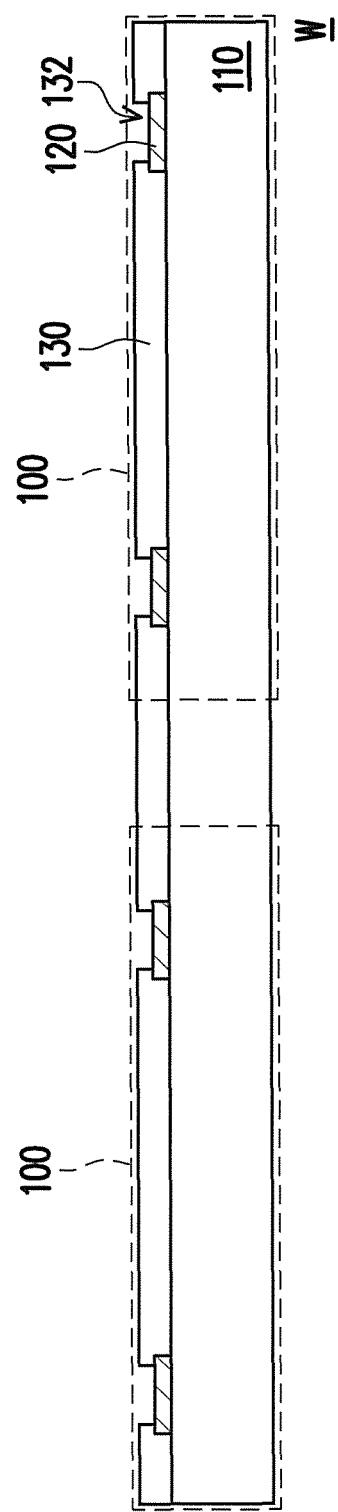
FIGS. 1 through 7 schematically illustrate a process flow for fabricating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1 through 7 schematically illustrate a process flow for fabricating a semiconductor device in accordance with some embodiments of the present disclosure.

Referring to FIG. 1, a wafer W including a plurality of dies or integrated circuits 100 arranged in an array is provided. Before a wafer dicing process is performed on the wafer W, the integrated circuits 100 of the wafer W are connected one another. In some embodiments, the wafer W includes a semiconductor substrate 110, a plurality of bonding pads 120 formed on the semiconductor substrate 110, and a passivation layer 130. The passivation layer 130 is formed over the semiconductor substrate 110 and includes a plurality of contact openings 132 such that the bonding pads 120 are partially exposed by the contact openings 132 of the passivation layer 130. For example, the semiconductor substrate 110 may be a silicon substrate including active components (e.g., transistors or the like) and passive components (e.g., resistors, capacitors, inductors or the like) formed therein; the bonding pads 120 may be copper pads or other suitable metal pads; and the passivation layer 130 may be a silicon oxide layer, a silicon nitride layer, a silicon oxynitride layer or a dielectric layer formed by other suitable dielectric materials.

Figure 2:
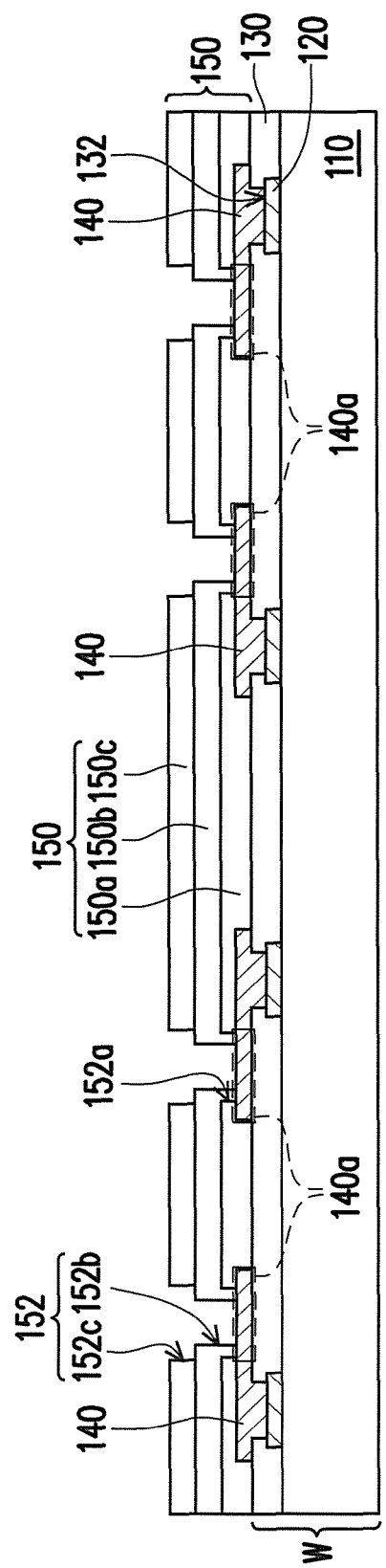

Referring to FIG. 2, a plurality of conductive patterns 140 are formed over the passivation layer 130 of the wafer W, and the conductive patterns 140 are electrically connected to the bonding pads 120 through the contact openings 132 of the passivation layer 130. The conductive patterns 140 are made of aluminum or other metals, for example. As shown in FIG. 2, each of the conductive pattern 140 includes a first end and a second end, the first end of the conductive pattern 140 is electrically connected to the bonding pads 120 through the contact openings 132 of the passivation layer 130, and the second end of the conductive pattern 140 may include a conductive pad 140a.

After the conductive patterns 140 including the conductive pads 140a are formed, a protection layer 150 (i.e. post-passivation layer) is formed over the passivation layer 130 to partially cover the conductive patterns 140. The protection layer 150 includes a plurality of contact openings 152, and the conductive pads 140a of the conductive patterns 140 are partially exposed by the contact openings 152 of the protection layer 150. In some embodiments, the protection layer 150 may include a plurality of patterned dielectric layers 150a, 150b, and 150c stacked on the passivation layer 130. The patterned dielectric layer 150a covers the passivation layer 130 and the conductive patterns 140, the patterned dielectric layer 150a includes a plurality of contact openings 152a, and the conductive pads 140a of the conductive patterns 140 are partially exposed by the contact openings 152a of the patterned dielectric layer 150a. The patterned dielectric layer 150b covers the patterned dielectric layers 150a and covers the conductive pads 140a which are partially exposed by the contact opening 150a, the patterned dielectric layer 150b includes a plurality of contact openings 152b, and the conductive pads 140a are partially exposed by the contact openings 152b of the patterned dielectric layer 150b. The patterned dielectric layer 150c partially covers the patterned dielectric layers 150b, the patterned dielectric layer 150c includes a plurality of contact openings 152c, and the contact opening 152c of the patterned dielectric layer 150c is located above the contact openings 152b of the patterned dielectric layer 150b.

The patterned dielectric layer 150a may be a silicon oxide layer, a silicon nitride layer, a silicon oxy-nitride layer or a dielectric layer formed by other suitable inorganic dielectric materials, for example. The patterned dielectric layer 150b may be a polyimide (PI) layer, a polybenzoxazole (PBO) layer, or other suitable polymer (or organic) layer, and the patterned dielectric layer 150c may be a polyimide (PI) layer, a polybenzoxazole (PBO) layer, or other suitable polymer (or organic) layer, for example. The patterned dielectric layer 150b and the patterned dielectric layer 150c may be made of the same material or different materials. During the fabrication of the polymer layers, a curing process is required to be performed after the patterning process of the polymer layer.

As shown in FIG. 2, the dimension (e.g., diameter) of the contact opening 152b is, for example, smaller than that of the contact opening 152a, and the dimension (e.g., diameter) of the contact opening 152c is, for example, greater than that of the contact opening 152b. In some embodiments, the dimension (e.g., diameter) of the contact opening 152a may be substantially equal to that of the contact opening 152c. Since the dimension of the contact opening 152b is smaller than that of the contact opening 152a, the patterned dielectric layer 150a is entirely covered by the patterned dielectric layer 150b, and the contact openings 152 of the protection layer 150 are constituted by the contact openings 152b and the contact openings 152c. It is noted that the dimensions of the contact opening 152a, 152b, and 152c are merely described for illustration, and the disclosure is not limited thereto.

As shown in FIG. 2, the stacked patterned dielectric layers 150a, 150b, and 150c may be inorganic dielectric layers, organic dielectric layers, or combinations thereof. The number of the patterned dielectric layers of the protection layer 150 is not limited in this disclosure. In some embodiments, an inorganic dielectric layer may be formed on the passivation layer 130, and an organic dielectric layer may be formed to cover the inorganic dielectric layer. In some alternative embodiments, an inorganic dielectric layer may be formed on the passivation layer 130, and a plurality of organic dielectric layers may be formed and stacked over the inorganic dielectric layer.

Figure 3:
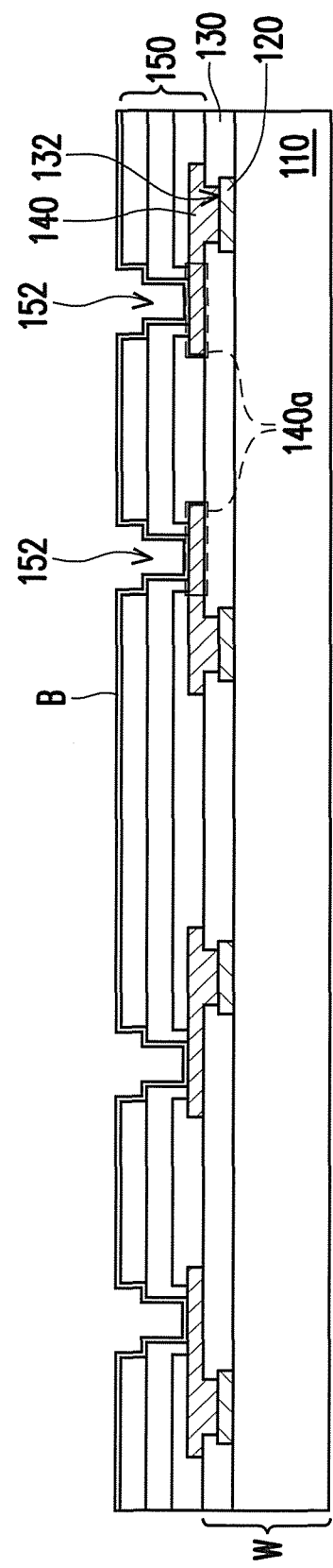

Referring to FIG. 3, after the protection layer 150 (i.e. post-passivation layer) including the contact opening 152 is formed, a barrier layer B is sputtered onto the protection layer 150 and the conductive pads 140a exposed by the contact openings 152. The barrier layer B conformally covers the surface of the protection layer 150 and the conductive pads 140a exposed by the contact openings 152. In some embodiments, the barrier layer B may be a conductive layer (e.g., Ti/Cu layer) formed by a sputtering process.

Figure 4:
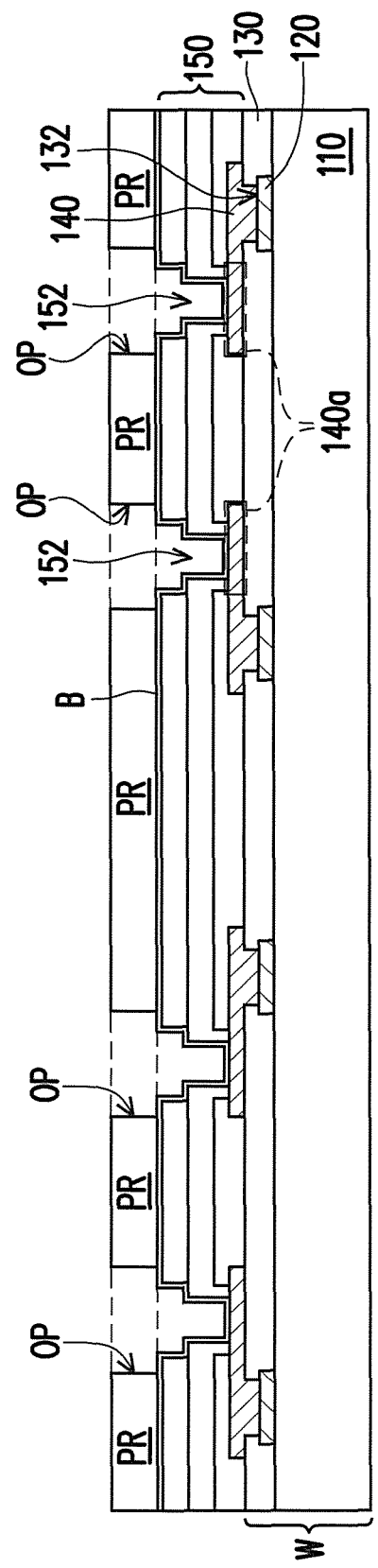

Referring to FIG. 4, a patterned photoresist layer PR including a plurality of openings OP is formed on the barrier layer B. The openings OP of the patterned photoresist layer PR are corresponding to the contact opening 152 of the protection layer 150. In other words, the openings OP of the patterned photoresist layer PR are located above the contact opening 152 of the protection layer 150. The barrier layer B is partially exposed by the openings OP of the patterned photoresist layer PR. The patterned photoresist layer PR is formed to determine the position where conductive vias or conductive pillars (not shown in FIG. 4) are formed.

In some embodiments, to facilitate the fabrication of the sequentially formed conductive vias or conductive pillars (not shown in FIG. 4), the dimension (e.g., diameter) of the openings OP is greater than that of the contact opening 152, for example. However, the dimension of the openings OP is merely described for illustration, and the disclosure is not limited thereto.

Figure 5:
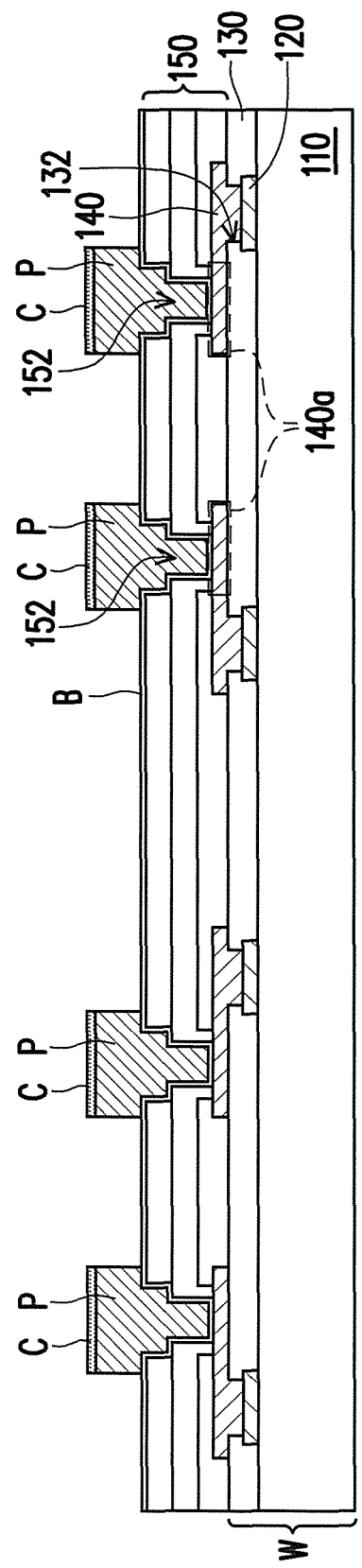

Referring to FIG. 5, a plating process is performed. During the plating process, the barrier layer B functions as a seed layer of the plating process and a plurality of pillar portions P are plated onto the barrier layer B. The pillar portions P are plated in the contact opening 152 and the openings OP. For example, the pillar portions P are copper pillars or other suitable metallic pillars. In some embodiments, a plurality of cap portions C may be optionally formed on the top surface of the pillar portions P through the above-mentioned plating process. In some embodiments, the cap portions C are solder caps or other suitable alloy caps.

When the materials of the cap portions C and the pillar portions P are different, intermetallic compound may be formed during the post thermal treatments. As shown in FIG. 5, the pillar portions P are not in contact with the protection layer 150 directly. In other words, the pillar portions P and the protection layer 150 are spaced by the barrier layer B. Accordingly, the barrier layer B is capable of blocking the intermetallic compound from diffusing onto the surface of the protection layer 150, and the adhesion between the protection layer 150 and the conductive via 160 is not deteriorated by the intermetallic compound.

After the plating process is performed, the patterned photoresist layer PR is removed, and the barrier layer B is partially exposed. Furthermore, the level height of the top surfaces of the conductive vias 160 is higher than the level height of the top surface of the protection layer 150.

Figure 6:
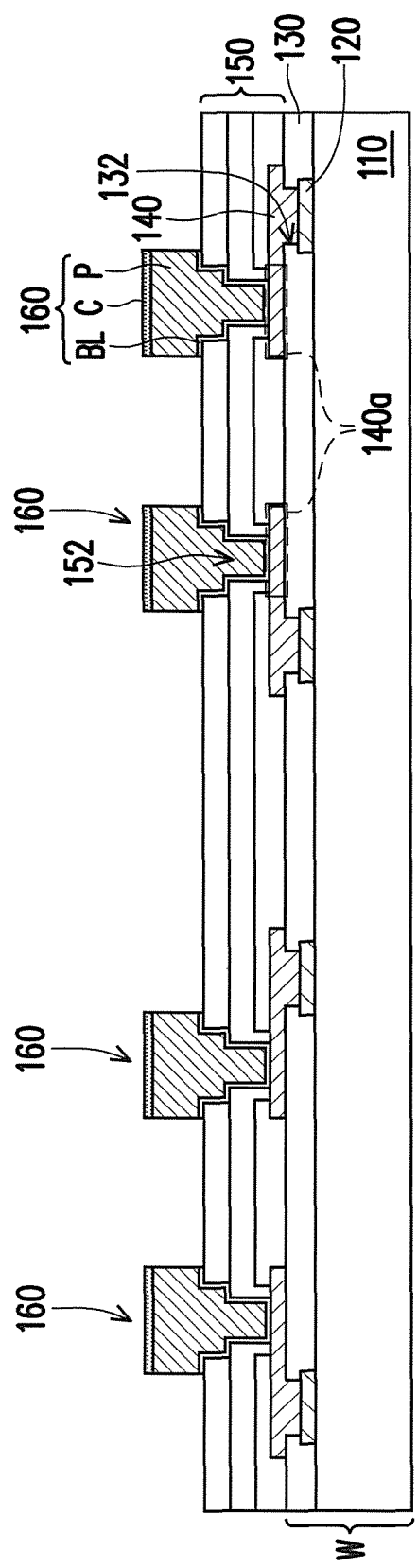

Referring to FIG. 5 and FIG. 6, by using the pillar portions P as a hard mask, part of the barrier layer B that is not covered by the pillar portions P are removed through an etching process until the protection layer 150 is exposed. After the barrier layer B is patterned, a plurality of barrier liner BL are formed under the pillar portions P. The barrier liner BL are self-aligned with the pillar portions P.

As shown in FIG. 6, after the barrier liner BL are formed, a plurality of conductive vias 160 are accomplished. Each of the conductive via 160 includes the barrier liner BL and the pillar portion P. The barrier liners BL are disposed in the contact openings 152, and the barrier liners BL cover the surface of the conductive pads 140a exposed by the contact openings 152. The pillar portions P are embedded in the contact openings 152, and the barrier liners BL are between the pillar portions P and the protection layer 150. Furthermore, the pillar portions P and the protection layer 150 are spaced by the barrier liners BL.

After the conductive vias 160 are formed, a back side grinding process is optionally performed on the rear surface of the wafer W. During the back side grinding process of the wafer W, the semiconductor substrate 110 is grinded so as to reduce the thickness of the wafer W.

Since the protection layer 150 (shown in FIG. 2) is formed prior to the fabrication of the conductive via 160 (shown in FIG. 6), the adhesion between the protection layer 150 and the conductive via 160 may not be affected by the thermal treatment (i.e. curing process) of the polymer layer(s) in the protection layer 150, and accordingly, the reliability of the semiconductor device is enhanced.

Figure 7:
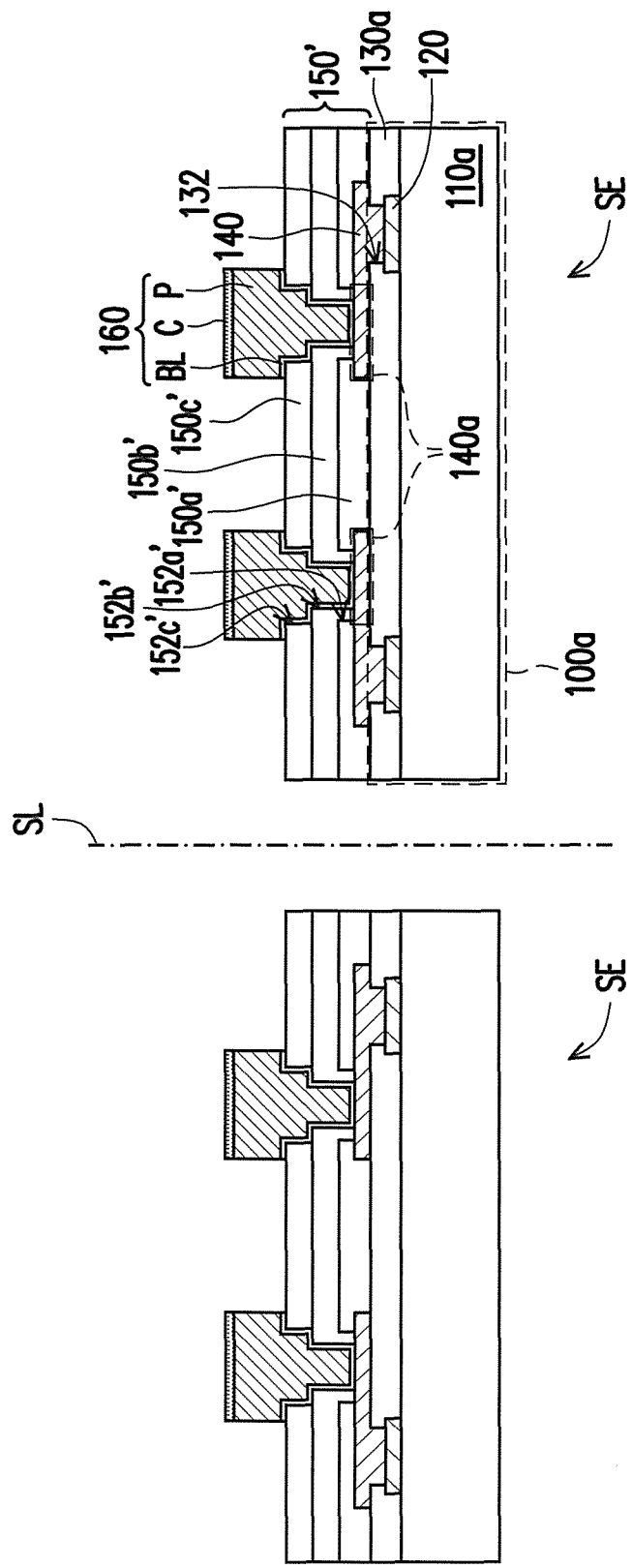

Referring to FIG. 7, a wafer dicing process is performed on the wafer W with such that a plurality of semiconductor devices SE are fabricated. Each one of the semiconductor device SE includes an integrated circuits 100a including at least one conductive pad 140a formed thereon, a protection layer 150', and at least one conductive via 160. The protection layer 150' covers the integrated circuit 110a, the protection layer 150' includes at least one contact opening 152, and the conductive pad 140a is exposed by the contact opening 152 of the protection layer 150'. The at least one conductive via 160 is embedded in the contact opening 152 of the protection layer 150', and the at least one conductive via 160 is electrically connected to the conductive pad 140a through the contact opening 152. As shown in FIG. 7, two conductive pads 140a, two contact openings 152, and two conductive vias 160 are shown for illustration, and however, the disclosure is not limited thereto.

As shown in FIG. 7, the protection layer 150' may include a plurality of patterned dielectric layers 150a', 150b', and 150c' stacked on the passivation layer 130. The patterned dielectric layer 150a' covers the passivation layer 130a and the conductive patterns 140, the patterned dielectric layer 150a' includes a plurality of contact openings 152a', and the conductive pads 140a of the conductive patterns 140 are partially exposed by the contact openings 152a' of the patterned dielectric layer 150a'. The patterned dielectric layer 150b' covers the patterned dielectric layers 150a' and covers the conductive pads 140a which are partially exposed by the contact opening 150a', the patterned dielectric layer 150b' includes a plurality of contact openings 152b', and the conductive pads 140a are partially exposed by the contact openings 152b' of the patterned dielectric layer 150b'. The patterned dielectric layer 150c' partially covers the patterned dielectric layers 150b', the patterned dielectric layer 150c' includes a plurality of contact openings 152c', and the contact opening 152c' of the patterned dielectric layer 150c' is located above the contact openings 152b' of the patterned dielectric layer 150b'.

In some embodiments, the level height of the top surfaces of the conductive vias 160 is higher than the level height of the top surface of the protection layer 150'.

In some embodiments, the integrated circuits 100a may include a semiconductor substrate 110a, the bonding pads 120 formed on the semiconductor substrate 110a, a passivation layer 130a, and a conductive pattern 140. As shown in FIG. 6 and FIG. 7, the materials and the characteristics of the semiconductor substrate 110a, the passivation layer 130a, and the protection layer 150' are the same as those of the semiconductor substrate 100, the passivation layer 130, and the protection layer 150. Thus, the detailed descriptions of the semiconductor substrate 110a, the passivation layer 130a, and the protection layer 150' are omitted.

FIGS. 8 through 15 schematically illustrate a process flow for fabricating an integrated fan-out package in accordance with some embodiments of the present disclosure.

Figure 8:
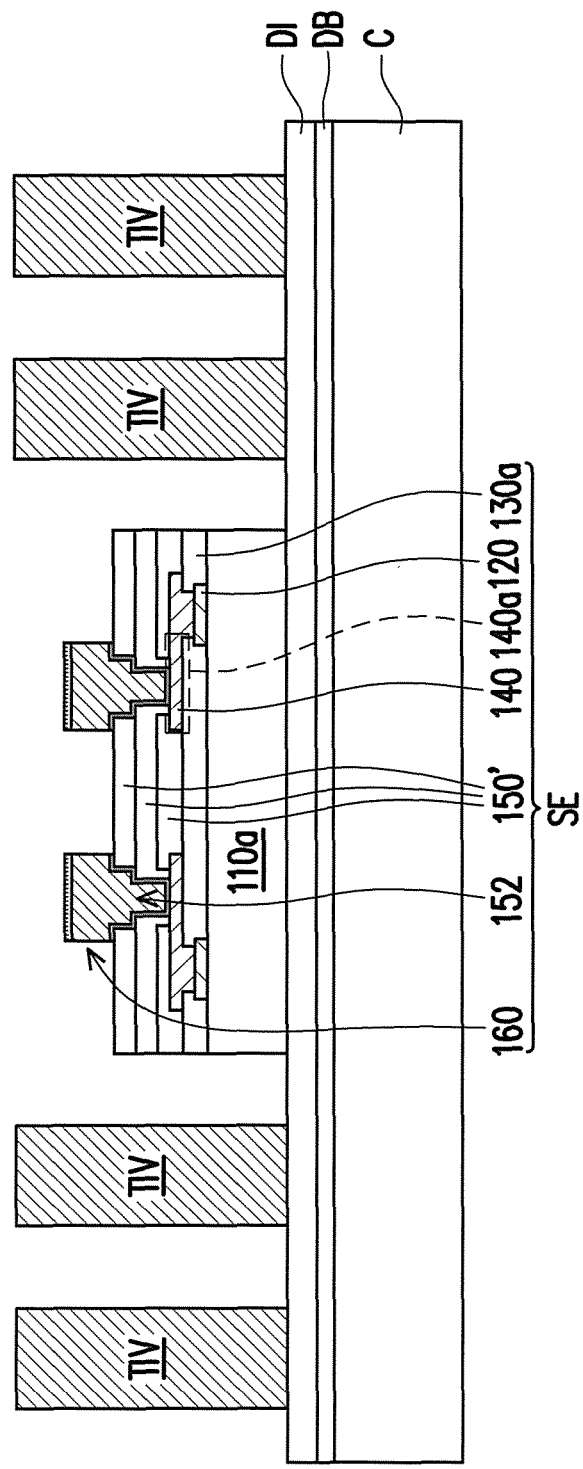
FIGS. 8 through 15 schematically illustrate a process flow for fabricating an integrated fan-out package in accordance with some embodiments of the present disclosure.

Referring to FIG. 8, a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example. After the carrier C having the de-bonding layer DB and the dielectric layer DI formed thereon is provided, a plurality of conductive through insulator vias TIV are formed on the dielectric layer DI. In some embodiments, the plurality of conductive through insulator vias TIV is formed by photoresist coating, photolithography, plating, and photoresist stripping process. For example, the conductive through insulator vias TIV include copper posts or other suitable metal post.

As shown in FIG. 8, in some embodiments, one of the semiconductor devices SE including the conductive vias 150 distributed thereon is picked and placed on the dielectric layer DI. The semiconductor device SE is attached or adhered on the dielectric layer DI through a die attachment film (DAF), an adhesion paste or the like. In some alternative embodiments, more than one of the semiconductor devices SE are picked and placed on the dielectric layer DI, wherein the semiconductor devices SE placed on the dielectric layer DI may be arranged in an array. When the semiconductor devices SE placed on the dielectric layer DI are arranged in an array, the conductive through insulator vias TIV may be classified into groups. The number of the semiconductor devices SE is corresponding to the number of the groups of the conductive through insulator vias TIV.

As shown in FIG. 8, the semiconductor device SE is picked and placed on the dielectric layer DI after the formation of the conductive through insulator vias TIV. However, the disclosure is not limited thereto. In some alternative embodiments, the semiconductor device SE is picked and placed on the dielectric layer DI before the formation of the conductive through insulator vias TIV.

Figure 9:
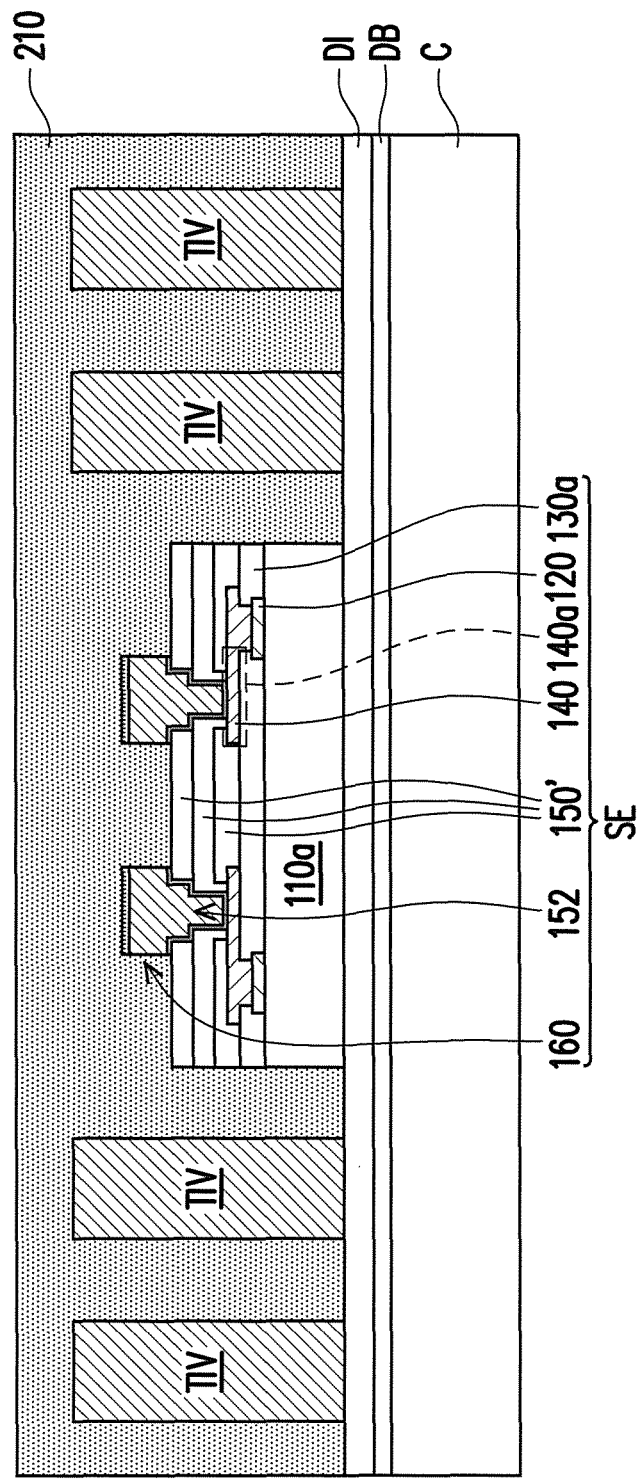

Referring to FIG. 9, an insulating material 210 is formed on the dielectric layer DI to cover the semiconductor device SE and the conductive through insulator vias TIV. In some embodiments, the insulating material 210 is a molding compound formed by a molding process. The conductive vias 160 and the protection layer 150' of the semiconductor device SE are covered by the insulating material 210. In other words, the conductive vias 160 and the protection layer 150' of the semiconductor device SE are not revealed and are well protected by the insulating material 210. In some embodiments, the insulating material 210 includes epoxy or other suitable dielectric materials.

Figure 10:
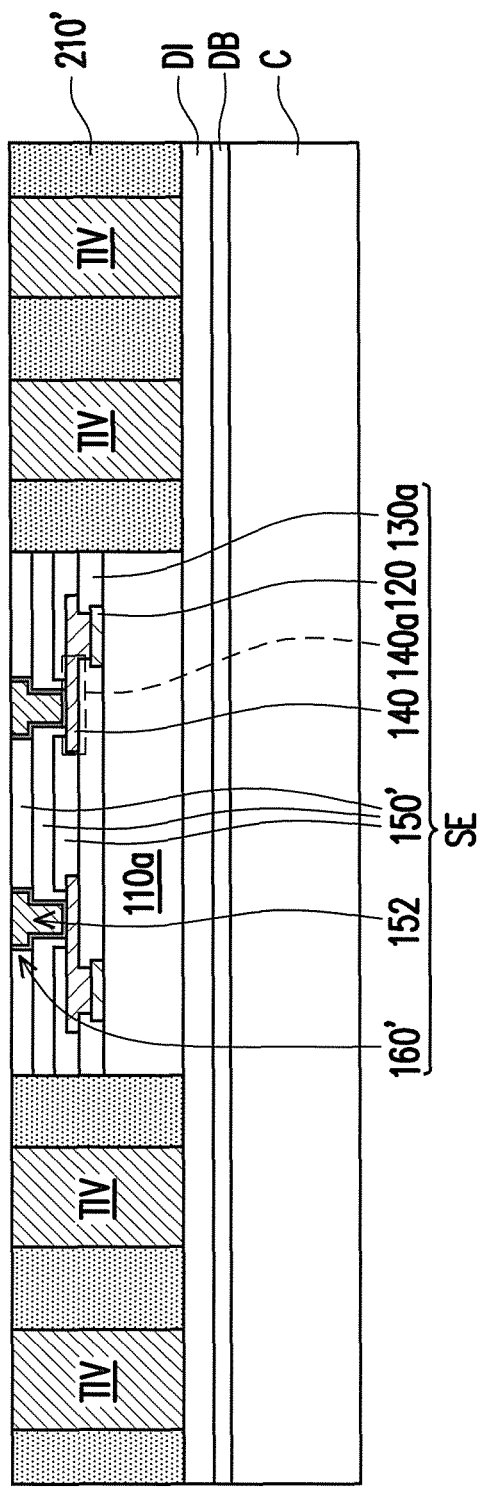

Referring to FIG. 10, the insulating material 210 is then grinded until the top surfaces of the conductive vis 160 and the top surface of the protection layer 150' are exposed. In some embodiments, the insulating material 210 is grinded by a mechanical grinding process and/or a chemical mechanical polishing (CMP) process. After the insulating material 210 is grinded, an insulating encapsulation 210' is formed over the dielectric layer DI. During the grinding process of the insulating material 210, parts of the conductive vias 160 outside the contact opening 152 are grinded such that a plurality of the conductive vias 160a are formed in the contact opening 152. In some embodiments, during the grinding process of the insulating material 210, parts of the conductive through insulator vias TIV are grinded also.

As shown in FIG. 10, the insulating encapsulation 210' encapsulates the sidewalls of the semiconductor device SE, and the insulating encapsulation 210' is penetrated by the conductive through insulator vias TIV. In other words, the semiconductor device SE and the conductive through insulator vias TIV are embedded in the insulating encapsulation 210'. It is noted that the top surfaces of the conductive through insulator vias TIV, the top surface of the insulating encapsulation 210', and the top surfaces of the conductive vias 160a are substantially coplanar with the top surface of the protection layer 150'.

Figure 11:
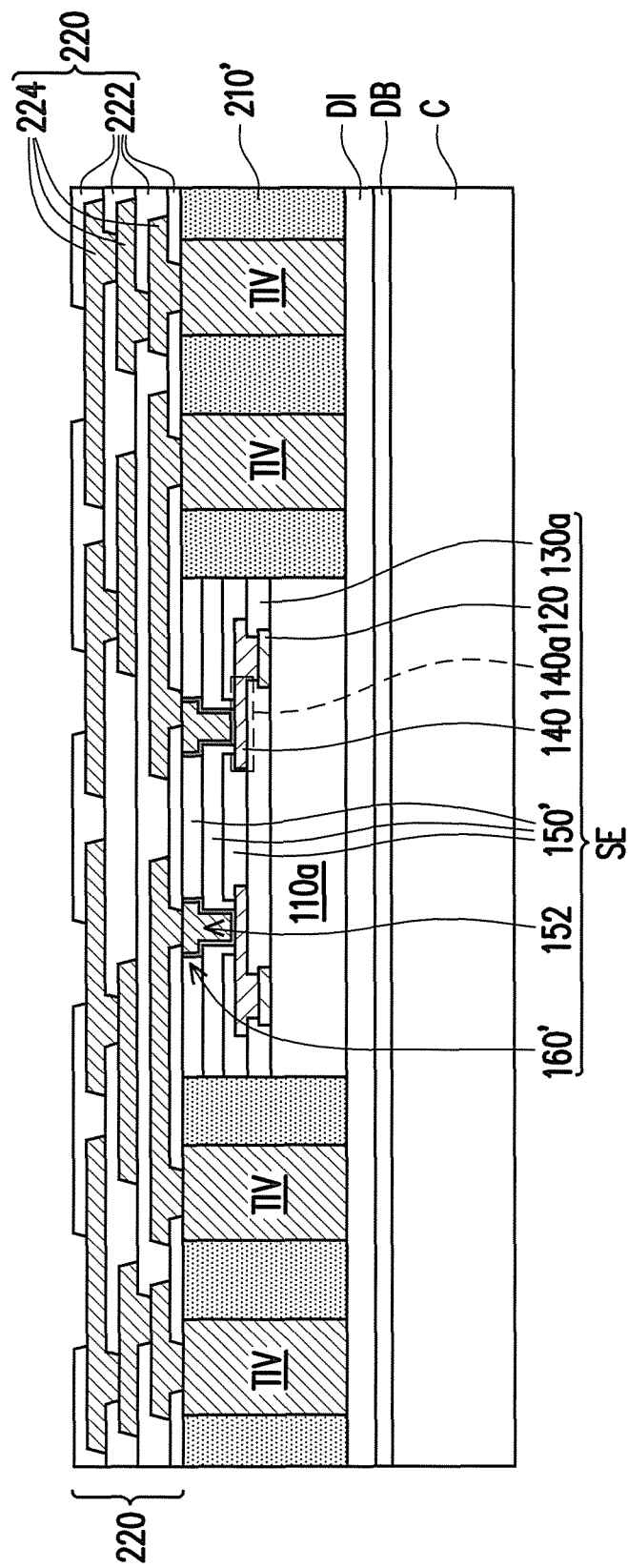

Referring to FIG. 11, after the insulating encapsulation 210' and the protection layer 150' are formed, a redistribution circuit structure 220 electrically connected to the conductive vias 160a of the semiconductor device SE is formed on the top surfaces of the conductive through insulator vias TIV, the top surface of the insulating encapsulation 210', the top surfaces of the conductive vias 160a, and the top surface of the protection layer 150'. The redistribution circuit structure 220 is described in accompany with FIG. 11 in detail.

Referring to FIG. 11, the redistribution circuit structure 220 includes a plurality of inter-dielectric layers 222 and a plurality of redistribution conductive layers 224 stacked alternately, and the redistribution conductive layers 224 are electrically connected to the conductive vias 160a of the semiconductor device SE and the conductive through insulator vias TIV embedded in the insulating encapsulation 210'. In some embodiments, the top surfaces of the conductive vias 160a and the top surfaces of the conductive through insulator vias TIV are in contact with the redistribution circuit structure 220. The top surfaces of the conductive vias 160a and the top surfaces of the conductive through insulator vias TIV are partially covered by the bottommost inter-dielectric layer 222.

Figure 12:
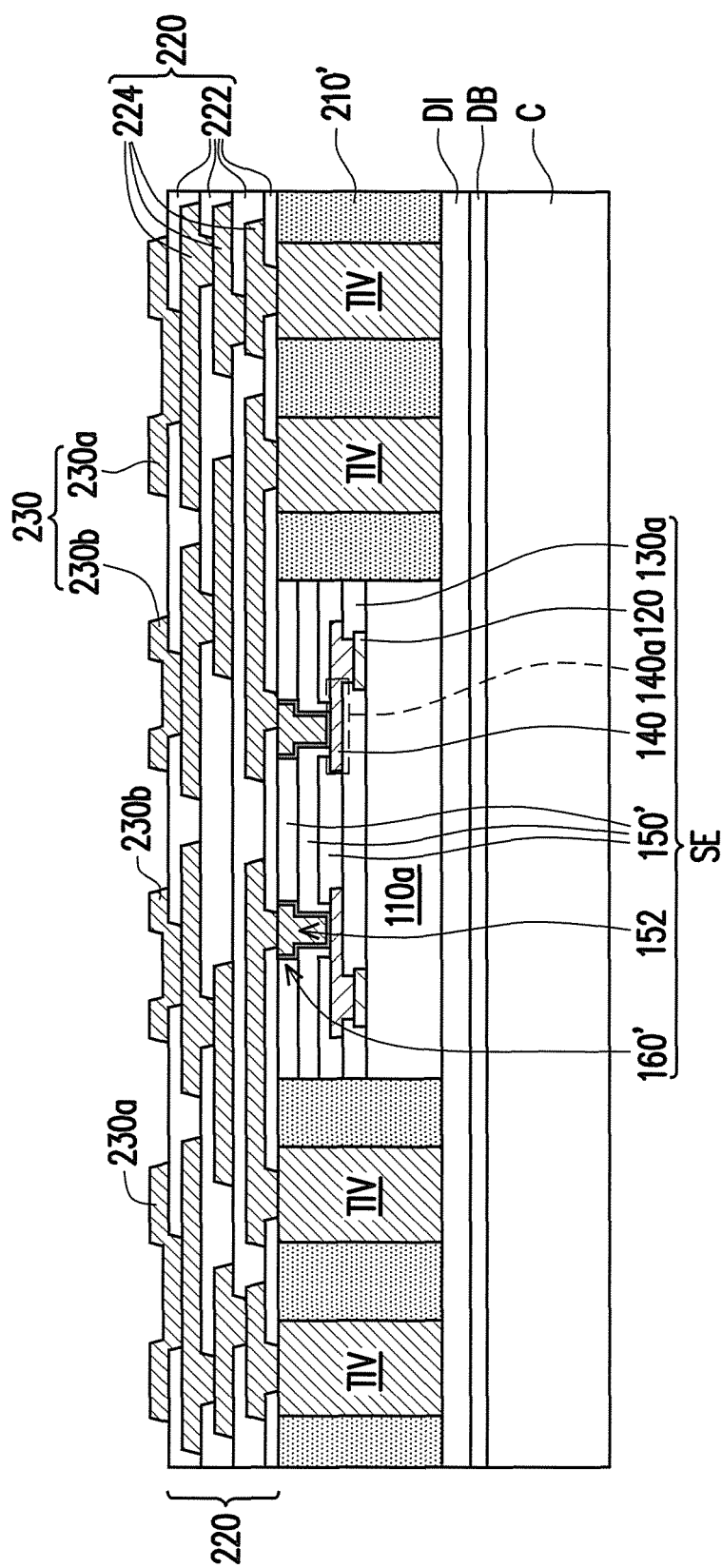

As shown in FIG. 12, after the redistribution circuit structure 220 is formed, a plurality of pads 230 are then formed on the topmost redistribution conductive layer 224 of the redistribution circuit structure 220. The pads 230 include a plurality of under-ball metallurgy (UBM) patterns 230a for ball mount and a plurality of connection pads 230b for mounting of passive components. The pads 230 are electrically connected to the topmost redistribution conductive layer 224 of the redistribution circuit structure 220. In other words, the pads 230 are electrically connected to the conductive vias 160a of the semiconductor device SE and the conductive through insulator vias TIV through the redistribution circuit structure 220. It is noted that the number of the UBM patterns 230a and the connection pads 230b is not limited in this disclosure.

Figure 13:
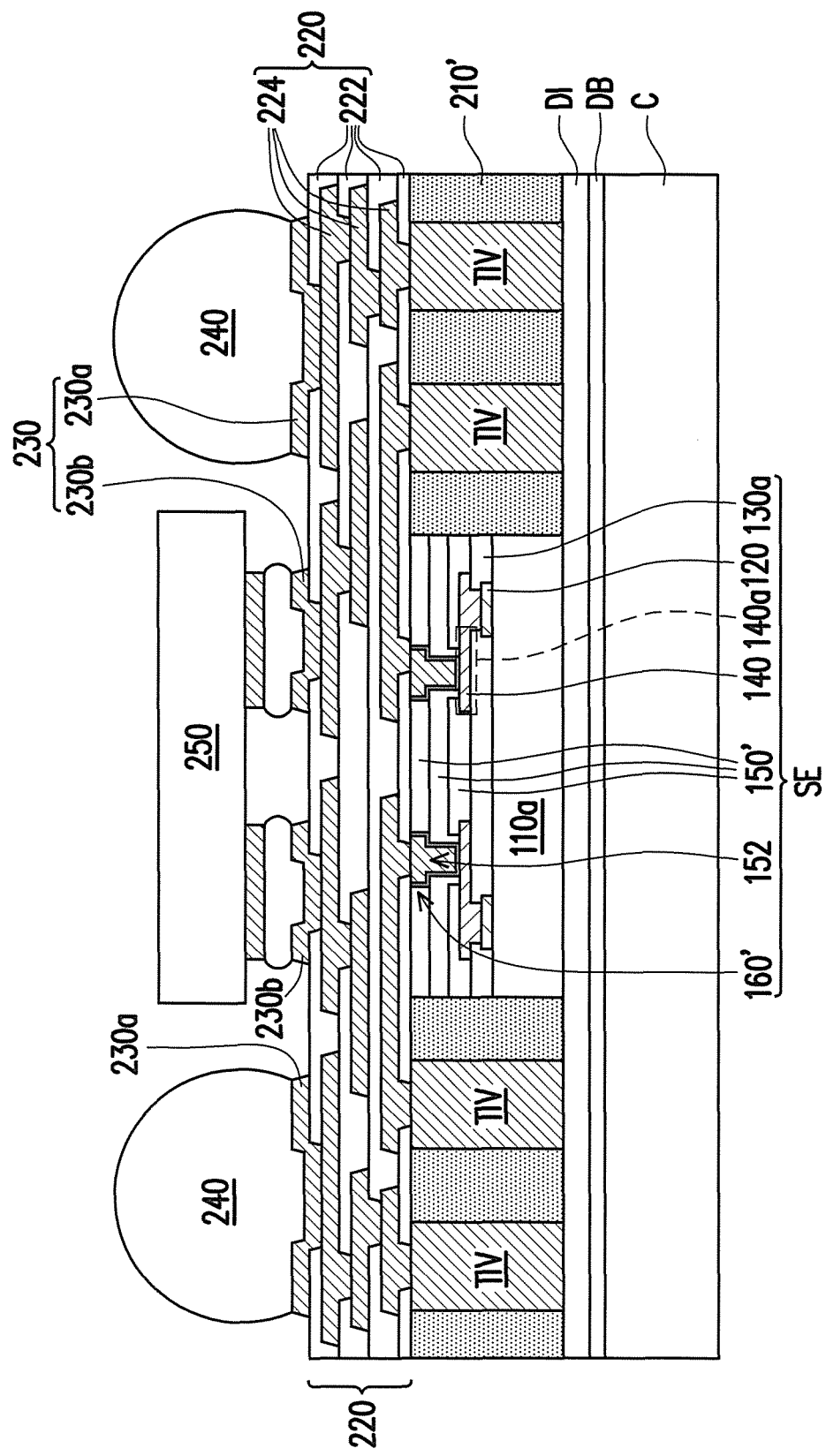

Referring to FIG. 13, after the UBM patterns 230a and the connection pads 230b are formed, a plurality of conductive balls 240 are placed on the under-ball metallurgy patterns 230a, and a plurality of passive components 250 are mounted on the connection pads 230b. In some embodiments, the conductive balls 240 may be placed on the under-ball metallurgy patterns 230a by a ball placement process, and the passive components 250 may be mounted on the connection pads 230b through a solder or reflow process. In some embodiments, the height of the conductive balls 240 is greater than the height of the passive components 250, for example.

Figure 14:
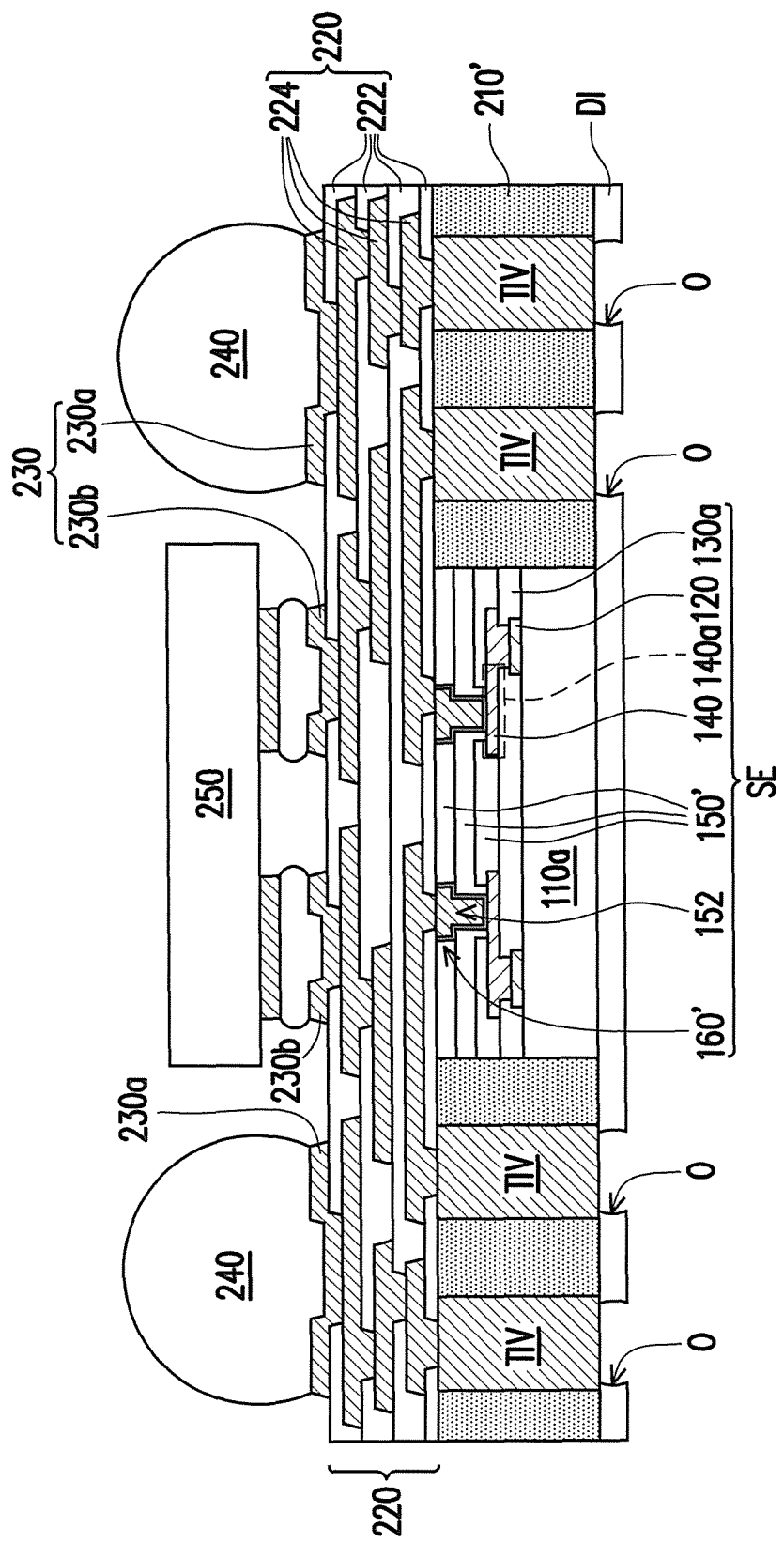

Referring to FIG. 13 and FIG. 14, after the conductive balls 240 and the passive components 250 are mounted on the pads 230, the dielectric layer DI formed on the bottom surface of the insulating encapsulation 210' is de-bonded from the de-bonding layer DB such the dielectric layer DI is separated from the carrier C. In some embodiments, the de-bonding layer DB (e.g., the LTHC release layer) may be irradiated by an UV laser such that the dielectric layer DI is peeled from the carrier C.

As shown in FIG. 14, the dielectric layer DI is then patterned such that a plurality of contact openings O are formed to expose the bottom surfaces of the conductive through insulator vias TIV. The number and position of the contact openings O are corresponding to the number of the conductive through insulator vias TIV. In some embodiments, the contact openings O of the dielectric layer DI are formed by a laser drilling process or other suitable patterning processes.

Figure 15:
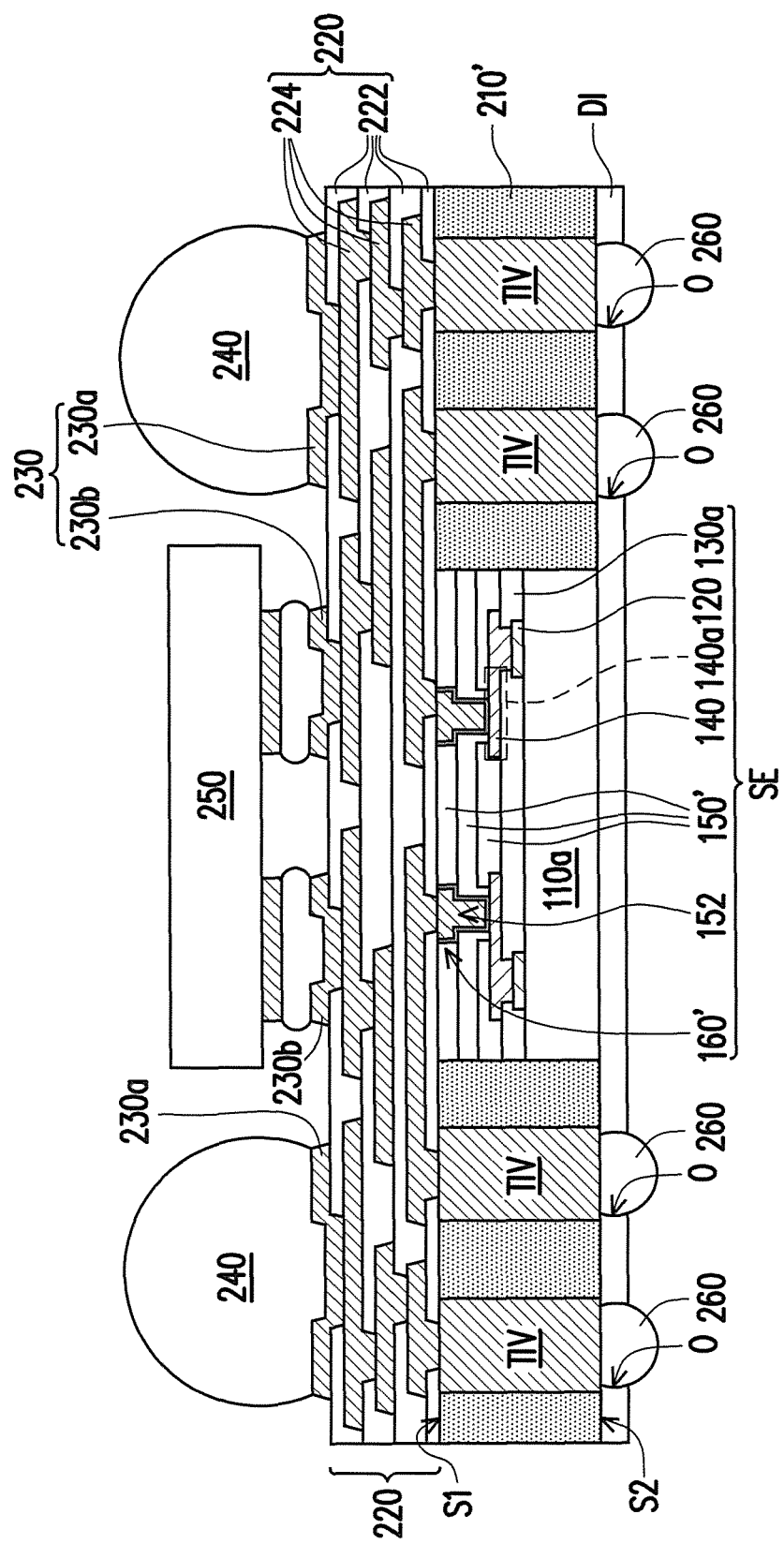

Referring to FIG. 15, after the contact openings O are formed in the dielectric layer DI, a plurality of conductive balls 260 are placed on the bottom surfaces of the conductive through insulator vias TIV that are exposed by the contact openings O. And, the conductive balls 250 are, for example, reflowed to bond with the bottom surfaces of the conductive through insulator vias TIV. As shown in FIG. 15, after the conductive balls 230 and the conductive balls 250 are formed, an integrated fan-out package of the integrated circuit 100 having dual-side terminal design (i.e. the conductive balls 240 and 260) is accomplished.

Figure 16:
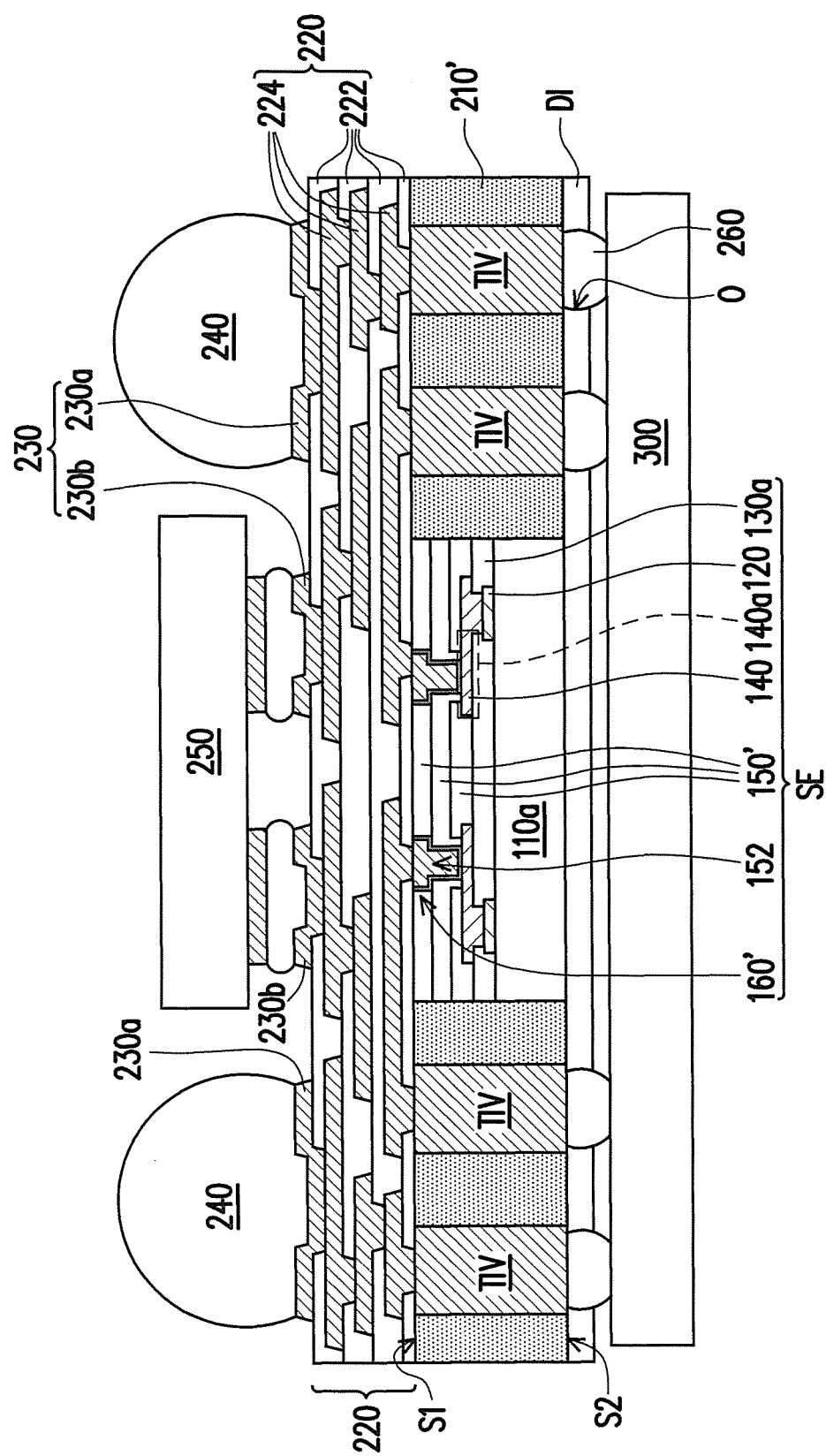
FIG. 16 is a cross-sectional view illustrating a package-on-package (POP) structure in accordance with some embodiments of the present disclosure.

FIG. 16 is a cross-sectional view illustrating a package-on-package (POP) structure in accordance with some embodiments of the present disclosure. Referring to FIG. 16, another package 300 is then provided. In some embodiments, the package 300 is, for example, a memory device or other suitable semiconductor devices. The package 300 is stacked over and is electrically connected to the integrated fan-out package illustrated in FIG. 15 through the conductive balls 260 such that a package-on-package (POP) structure is fabricated.

Since the protection layer 150 is formed before the formation of the conductive via 160, the adhesion between the conductive via 160 and the protection layer 150 is good, and no delamination occurs at the interface between the conductive via 160 and the protection layer 150.

According to some embodiments, a semiconductor device including an integrated circuit, a protection layer, and a conductive via is provided. The integrated circuit includes at least one conductive pad. The protection layer covers the integrated circuit. The protection layer includes a contact opening, and the conductive pad is exposed by the contact opening of the protection layer. The conductive via is embedded in the contact opening of the protection layer, and the conductive via is electrically connected to the conductive pad through the contact opening.

According to some alternative embodiments, an integrated fan-out package including a semiconductor device, an insulating encapsulation, and a redistribution circuit structure is provided. The semiconductor device includes an integrated circuit, a protection layer, and a conductive via. The integrated circuit includes at least one conductive pad. The protection layer covers the integrated circuit. The protection layer includes a contact opening, and the conductive pad is exposed by the contact opening of the protection layer. The conductive via is embedded in the contact opening of the protection layer, and the conductive via is electrically connected to the conductive pad through the contact opening. The insulating encapsulation encapsulates the semiconductor device. The redistribution circuit structure is disposed on the semiconductor device and the insulating encapsulation, and the redistribution circuit structure is electrically connected to the conductive vias of the semiconductor device.

According to some alternative embodiments, a method of fabricating a semiconductor device including the following steps is provided. An integrated circuit including at least one conductive pad is provided. A protection layer is formed on the integrated circuit, wherein the protection layer includes a contact opening, and the conductive pad is exposed by the contact opening of the protection layer. A conductive via is formed after forming the protection layer, wherein the conductive via is embedded in the contact opening of the protection layer, and the conductive via is electrically connected to the conductive pad through the contact opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package, comprising:
  a semiconductor device comprising an integrated circuit component having a plurality of conductive pads, a protection layer covering the integrated circuit component, and a plurality of conductive vias, wherein the protection layer comprises a plurality of contact openings located above the conductive pads, the conductive vias are embedded in the contact openings of the protection layer and electrically connected to the conductive pads through the contact openings of the protection layer, and top surfaces of the conductive vias are substantially coplanar with a top surface of the protection layer;
  an insulating encapsulation laterally encapsulating sidewalls of the semiconductor device, wherein the conductive vias and the insulating encapsulation are spaced apart by the protection layer, and the top surfaces of the conductive vias are substantially coplanar with a top surface of the insulating encapsulation; and
  a redistribution circuit structure disposed on top surfaces of the conductive vias, the top surface of the protection layer and a top surface of the insulating encapsulation, wherein the redistribution circuit structure is electrically connected to the conductive vias.

2. The package as claimed in claim 1, wherein the protection layer comprises a plurality of patterned dielectric layers stacked over the integrated circuit component.

3. The package as claimed in claim 1, wherein the protection layer comprises:
  an inorganic dielectric layer covering the integrated circuit component; and
  an organic dielectric layer covering the inorganic dielectric layer.

4. The package as claimed in claim 1, wherein the protection layer comprises:
  an inorganic dielectric layer covering the integrated circuit component; and
  a plurality of organic dielectric layers stacked over the inorganic dielectric layer.

5. The package as claimed in claim 1, wherein each of the conductive vias comprises:
  a barrier liner covering sidewalls of the contact openings and partially covering one of the conductive pads; and
  a pillar portion disposed on the barrier liner and in the contact openings.

6. The package as claimed in claim 5, wherein the pillar portion and the protection layer are spaced apart by the barrier liner.

7. A method of fabricating an integrated fan-out package, comprising:
  providing an integrated circuit component having a plurality of conductive pads thereon;
  forming a protection layer on the integrated circuit component, wherein the protection layer comprises a plurality of contact openings located above the conductive pads;
  forming a plurality of first conductive vias in the contact openings after forming the protection layer, wherein the first conductive vias are electrically connected to the conductive pads through the contact openings and the first conductive vias protrude from a top surface of the protection layer;
  forming an insulating material to cover the integrated circuit component having the conductive pads, the protection layer and the first conductive vias formed thereon;
  partially removing the insulating material and the first conductive vias until the protection layer is exposed so as to form an insulating encapsulation and a plurality of second conductive vias in the contact openings, wherein the integrated circuit component having the conductive pads, the protection layer and the second conductive vias formed thereon is laterally encapsulated by the insulating encapsulation, and top surfaces of the second conductive vias are substantially coplanar with top surfaces of the protection layer and the insulating encapsulation; and
  forming a redistribution circuit structure disposed on the top surfaces of the second conductive vias, the top surface of the protection layer and the top surface of the insulating encapsulation, wherein the redistribution circuit structure is electrically connected to the second conductive vias.

8. The method as claimed in claim 7, wherein forming the first conductive vias comprises:
  forming a barrier layer on the protection layer and the conductive pads exposed by the contact openings;
  forming a photoresist layer on the barrier layer, wherein the photoresist layer has a plurality of opening located above the contact openings;
  forming a plurality of pillar portions of the first conductive vias in the contact openings of the protection layer and the openings of the photoresist layer;
  removing the photoresist layer after forming the pillar portions; and
  patterning the barrier layer by using the pillar portions as a mask to form a plurality of barrier liners of the first conductive vias between the pillar portions and the protection layer.

9. The method as claimed in claim 8, wherein the openings are greater than the contact openings in diameter.

10. The method as claimed in claim 8, wherein the insulating material and the first conductive vias are partially removed through a grinding process, and parts of the first conductive vias that are located outside of the contact openings are grinded during the grinding process.

11. The method as claimed in claim 7, wherein forming the first conductive vias comprises:
  forming a barrier layer on the protection layer and the conductive pads exposed by the contact openings;
  forming a photoresist layer on the barrier layer, wherein the photoresist layer has a plurality of opening located above the contact openings;
  forming a plurality of pillar portions of the first conductive vias in the contact openings of the protection layer and the openings of the photoresist layer;

forming a plurality of cap portions of the first conductive vias on the pillar portions;
removing the photoresist layer after forming the pillar portions and the cap portions; and
patterning the barrier layer by using the pillar portions as a mask to form a plurality of barrier liners of the first conductive vias between the pillar portions and the protection layer.

12. The method as claimed in claim 11, wherein the openings are greater than the contact openings in diameter.

13. The method as claimed in claim 11, wherein the insulating material and the first conductive vias are partially removed through a grinding process, and parts of the first conductive vias that are located outside of the contact openings and the cap portions are grinded during the grinding process.

14. A method of fabricating an integrated fan-out package, comprising:
providing a semiconductor device having a plurality of first conductive vias, wherein the first conductive vias protrude from a top surface of the semiconductor device;
forming an insulating material to cover the first conductive vias, the top surface of the semiconductor device and sidewalls of the semiconductor device;
partially removing the insulating material and the first conductive vias to form an insulating encapsulation and a plurality of second conductive vias embedded in the semiconductor device, wherein the insulating encapsulation laterally encapsulates the sidewalls of the semiconductor device and top surfaces of the second conductive vias are substantially coplanar with the top surface of the semiconductor device; and
forming a redistribution circuit structure on the top surfaces of the second conductive vias, the top surface of the semiconductor device and the top surface of the insulating encapsulation, wherein the redistribution circuit structure is electrically connected to the second conductive vias.

15. The method as claimed in claim 14, wherein providing the semiconductor device comprises:
providing a wafer comprising a plurality of integrated circuit components, wherein each of the integrated circuit components has a plurality of conductive pads thereon;
forming a protection layer on the wafer, wherein the protection layer comprises a plurality of contact openings located above the conductive pads;
forming a plurality of first conductive vias in the contact openings after forming the protection layer, wherein the first conductive vias are electrically connected to the conductive pads through the contact openings and the first conductive vias protrude from a top surface of the protection layer;
forming a barrier layer on the protection layer and the conductive pads exposed by the contact openings;
forming a photoresist layer on the barrier layer, wherein the photoresist layer has a plurality of opening located above the contact openings;

forming a plurality of pillar portions of the first conductive vias in the contact openings of the protection layer and the openings of the photoresist layer;
removing the photoresist layer after forming the pillar portions; and
patterning the barrier layer by using the pillar portions as a mask to form a plurality of barrier liners of the first conductive vias between the pillar portions and the protection layer; and
performing a dicing process on the wafer to obtain the semiconductor.

16. The method as claimed in claim 15, wherein the openings are greater than the contact openings in diameter.

17. The method as claimed in claim 15, wherein the insulating material and the first conductive vias are partially removed through a grinding process, and parts of the first conductive vias that are located outside of the contact openings are grinded during the grinding process.

18. The method as claimed in claim 14, wherein providing the semiconductor device comprises:
providing a wafer comprising a plurality of integrated circuit components, wherein each of the integrated circuit components has a plurality of conductive pads thereon;
forming a protection layer on the wafer, wherein the protection layer comprises a plurality of contact openings located above the conductive pads;
forming a plurality of first conductive vias in the contact openings after forming the protection layer, wherein the first conductive vias are electrically connected to the conductive pads through the contact openings and the first conductive vias protrude from a top surface of the protection layer;
forming a barrier layer on the protection layer and the conductive pads exposed by the contact openings;
forming a photoresist layer on the barrier layer, wherein the photoresist layer has a plurality of opening located above the contact openings;
forming a plurality of pillar portions of the first conductive vias in the contact openings of the protection layer and the openings of the photoresist layer;
forming a plurality of cap portions of the first conductive vias on the pillar portions;
removing the photoresist layer after forming the pillar portions and the cap portions;
patterning the barrier layer by using the pillar portions as a mask to form a plurality of barrier liners of the first conductive vias between the pillar portions and the protection layer; and
performing a dicing process on the wafer to obtain the semiconductor.

19. The method as claimed in claim 18, wherein the openings are greater than the contact openings in diameter.

20. The method as claimed in claim 18, wherein the insulating material and the first conductive vias are partially removed through a grinding process, and parts of the first conductive vias that are located outside of the contact openings and the cap portions are grinded during the grinding process.

* * * * *